United States Patent
Puzenat et al.

(10) Patent No.: US 10,322,619 B2
(45) Date of Patent: Jun. 18, 2019

(54) CONTROL MODULE FOR AN ELECTRIC APPLIANCE

(71) Applicant: Valeo Systemes Thermiques, Le Mesnil-Saint-Denis (FR)

(72) Inventors: Bertrand Puzenat, Montigny-le-Bretonneux (FR); Thierry Elbhar, Les Bréviaires (FR); Jean-Baptiste Audoye, Paris (FR); Alain Renard, Gambaiseuil (FR)

(73) Assignee: Valeo Systemes Thermiques, Le Mesnil Saint-Denis (FR)

( * ) Notice: Subject to any disclaimer, the term of this patent is extended or adjusted under 35 U.S.C. 154(b) by 924 days.

(21) Appl. No.: 14/778,642

(22) PCT Filed: Mar. 21, 2014

(86) PCT No.: PCT/EP2014/055700
§ 371 (c)(1),
(2) Date: Sep. 21, 2015

(87) PCT Pub. No.: WO2014/154581
PCT Pub. Date: Oct. 2, 2014

(65) Prior Publication Data
US 2016/0039267 A1    Feb. 11, 2016

(30) Foreign Application Priority Data

Mar. 26, 2013   (FR) .................... 13 52738

(51) Int. Cl.
*B60H 1/22*  (2006.01)
*F24H 3/04*  (2006.01)
(Continued)

(52) U.S. Cl.
CPC ......... *B60H 1/2218* (2013.01); *F24H 3/0429* (2013.01); *F24H 9/2071* (2013.01);
(Continued)

(58) Field of Classification Search
USPC ......................................... 361/768, 760, 761
See application file for complete search history.

(56) References Cited

U.S. PATENT DOCUMENTS

| 2007/0057742 A1* | 3/2007 | Mitome | H03B 5/04 331/158 |
| 2007/0167037 A1* | 7/2007 | Thiel | H01R 12/58 439/70 |
| 2009/0321290 A1* | 12/2009 | Kuo | A63B 47/005 206/315.9 |

FOREIGN PATENT DOCUMENTS

| DE | 10 2006 009 812 B4 | 9/2008 |
| FR | 2 954 606 A1 | 6/2011 |
| JP | H10-256677 A | 9/1998 |

OTHER PUBLICATIONS

International Search Report issued in corresponding application No. PCT/EP2014/055700 dated Jun. 30, 2014 (3 pages).

* cited by examiner

*Primary Examiner* — Andargie M Aychillhum
(74) *Attorney, Agent, or Firm* — Osha Liang LLP

(57) ABSTRACT

The invention relates to a control module (13) for an electric appliance (10), comprising a printed circuit board (19) whereon electrical and electronic components (26) are mounted along with at least one power transistor (18) fixed to a first region (20) of the printed circuit board (19) and comprising a drain (D) connected to a first electrically conductive track (22) of said first region (20) and a source (S) connected to a second electroconductive track (23) of a second region (21) of the printed circuit board (19). At least one opening (27) forms a material discontinuity between the first and second regions (20, 21) of the printed circuit board (19), said opening (27) being arranged between the first and second conductive tracks (22, 23).

6 Claims, 4 Drawing Sheets

Figure 1:
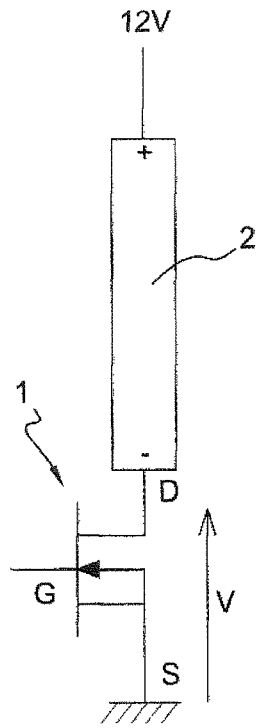

(51) Int. Cl.
*F24H 9/20* (2006.01)
*H05K 1/02* (2006.01)
(52) U.S. Cl.
CPC ..... *H05K 1/0201* (2013.01); *H05K 2201/062* (2013.01); *H05K 2201/09063* (2013.01); *H05K 2201/09754* (2013.01); *H05K 2201/10166* (2013.01)

CONTROL MODULE FOR AN ELECTRIC APPLIANCE

The present invention relates to a control module for an electric appliance, and a heating device, notably for a motor vehicle, comprising such a control module.

The invention applies notably to the technical field of add-on electric heating devices for motor vehicles. Such heating devices are notably used in the first minutes of starting of the motor vehicle, when the engine is not hot enough to ensure the supply of hot air into the vehicle interior. This warm-up time is, for example, between 15 and 20 minutes for a diesel-type engine.

Such an add-on heating device generally comprises a support frame on which are mounted parallel heating modules arranged so as to be passed through by a flow of air to be heated.

Each heating module comprises two electrodes between which are placed resistive elements of positive temperature coefficient type. Two opposing heat sinks are fixed onto the electrodes, so as to increase the surface area of exchange with the flow of air to be heated. The heat sinks are, for example, formed by pleated or corrugated metal strips.

Each heating module thus comprises a positive terminal linked electrically to the positive terminal of a battery, and a negative terminal linked electrically to the negative terminal or ground of the battery via a power transistor, such as a field-effect transistor with metal-oxide gate, also called MOSFET.

More particularly, each MOSFET is soldered onto a printed circuit board of a control module, also called driver. The control module is mounted in a casing fixed to the support frame.

Each MOSFET comprises a first terminal called drain and linked to the negative terminal of the corresponding heating module, a second terminal called source and linked to the negative terminal or ground of the battery, and a third terminal called gate serving as input for a control signal making it possible to control the opening and the closing of the MOSFET.

The different electrical links can notably be provided by conductor bars linked mechanically together by an electrically insulating fitting fixed onto the printed circuit board.

Such a heating device is notably known from the document FR 2 954 606 in the name of the Applicant.

When a MOSFET is open, no current flows through the corresponding resistive elements. Conversely, when the MOSFET is closed, a current passes into the resistive elements so as to provoke the heating of the electrodes and of the heat sinks.

When a MOSFET is closed, that is to say when it is in the on state, it has a resistance Rdson with a value, for example, of the order of 4 m$\Omega$. Since the current passing into the MOSFET and the resistive elements is relatively great, a quantity of heat of, for example, between 2 W and 3 W is dissipated by the MOSFET in normal operation.

There is also a very low risk of the MOSFET being damaged in operation. In most cases, this damage translates into an impeding short-circuit state between the drain and the source. In other words, the MOSFET behaves as if an impedance internal to the MOSFET were mounted in parallel between the drain and the source. This impedance has, for example, a value of the order of 40 m$\Omega$. The heat then dissipated by the MOSFET is, for example, of the order of 30 W.

This heat can, ultimately, lead to a progressive degradation of the material of the printed circuit board, this degradation transforming this usually insulating material into a relatively conductive material.

If such a degradation extends between the drain and the source, more particularly between the conductive tracks to which the drain and the source are electrically linked, the degraded material of the printed circuit board acts as a resistor. In parallel, the MOSFET ends up opening completely so that the negative terminal of the heating element is linked to the negative terminal or ground of the battery via the resistor formed by the degraded material of the printed circuit board. In this case, this resistor is, for example of the order 10$\Omega$. The heat dissipated by this resistance is then of the order to 10 to 15 W.

Given the significant quantity of heat to be dissipated in this case, there is a risk of this heat causing a fire to start or fumes to be released on the printed circuit board and/or surrounding elements.

The aim of the invention is notably to provide a simple, effective and economic solution to this problem.

To this end, it proposes a control module for an electric appliance comprising a printed circuit board, on which are mounted electrical and electronic components and at least one power transistor, for example a field-effect transistor with metal-oxide gate, fixed onto a first area of the printed circuit board and comprising a first terminal called drain, linked to a first electrically conductive track of said first area, a second terminal called source and linked to a second electrically conductive track of a second area of the printed circuit board and a third terminal called gate, characterized in that the printed circuit board comprises at least one opening forming a discontinuity of material, at least partial, between the first and second areas of the printed circuit board, said opening being situated between the first and second conductive tracks.

In this way, in the event of damage to the power transistor, even if the material of the first area of the printed circuit board is degraded, the opening creates a discontinuity of material between the first and second areas of the printed circuit board and between the associated first and second conductive tracks.

In the particular case of the abovementioned heating device, there is thus prevention, in the event of degradation of the MOSFET, against the negative terminal of the heating element being linked to the negative or ground terminal of the battery, via a resistor formed by degraded material. The risk of a fire being started or the associated risk of smoke being generated is therefore avoided.

According to one embodiment of the invention, the power transistor comprises a sole plate forming the drain, in electrical contact with the first track, and a pin forming the source, linked electrically to the second track.

Preferably, the opening is a slit encircling, at least partially, the first area of the printed circuit board.

In this case, the slit can be generally U- or L-shaped and comprise a base from which extends at least one branch.

The invention relates also to a heating device, notably for a motor vehicle, comprising a control module of the abovementioned type. The heating device also comprises at least one heating module comprising a first terminal linked electrically to a first terminal of a battery, a second terminal linked electrically to the drain of the power transistor, via a first electrical link member, a second terminal of the battery being linked electrically to the source of the power transistor, via a second electrical link member, the first terminal of the heating module being linked electrically to the first terminal of the battery via a third electrical link member, the three link members being linked mechanically to one another via an electrically insulating fitting.

The link members are, for example, conductor bars.

Figure 2:
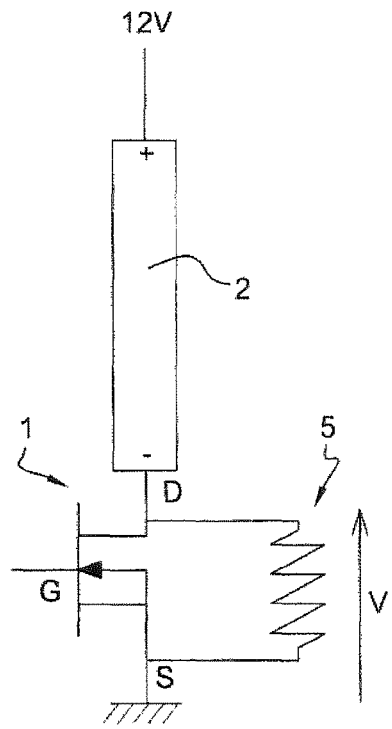
Figure 3:
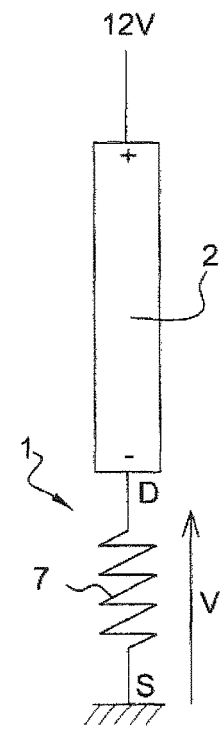
Figure 4:
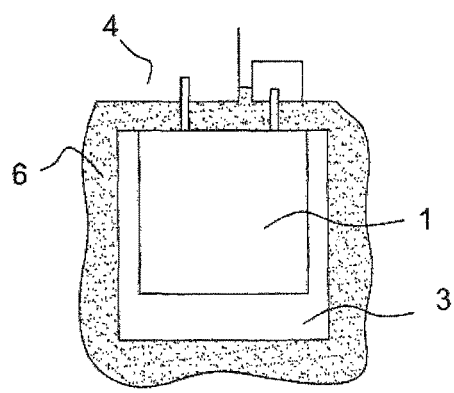
Figure 5:
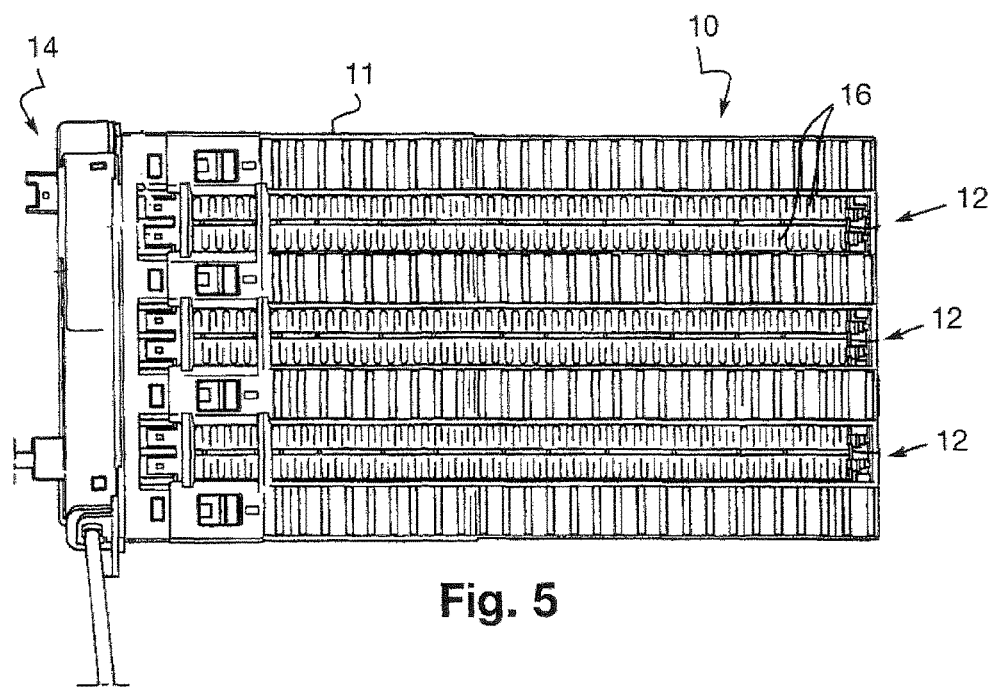
Figure 6:
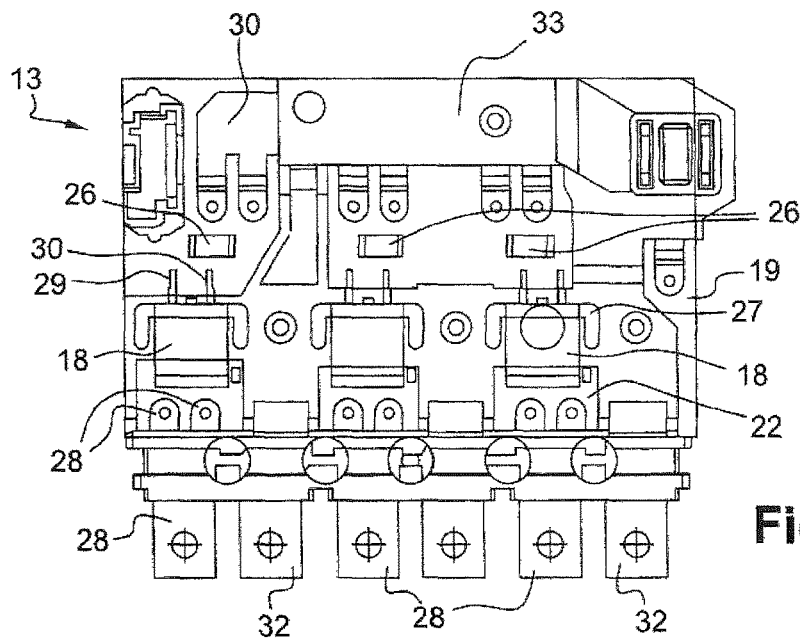
Figure 7:
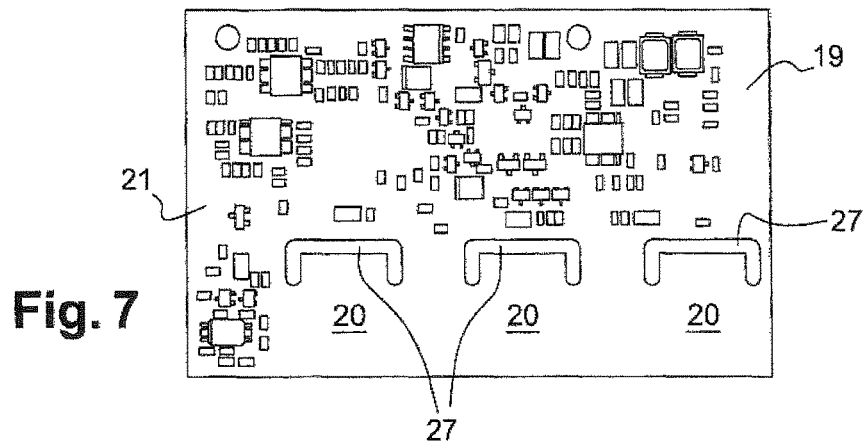
Figure 8:
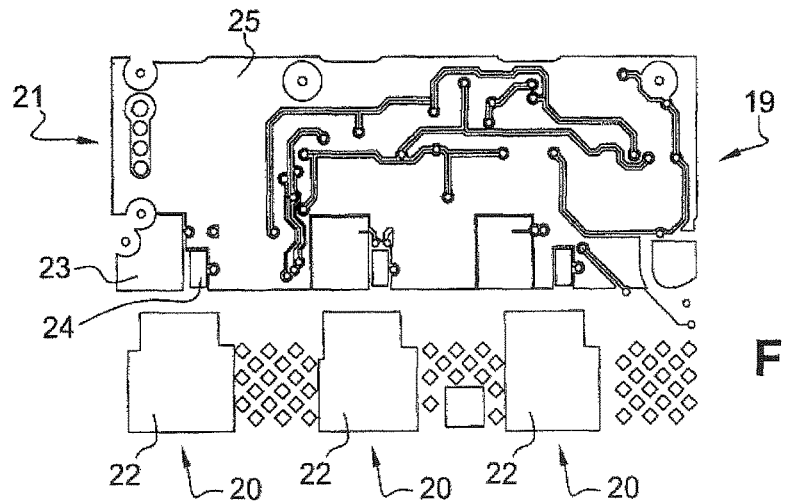
Figure 9:
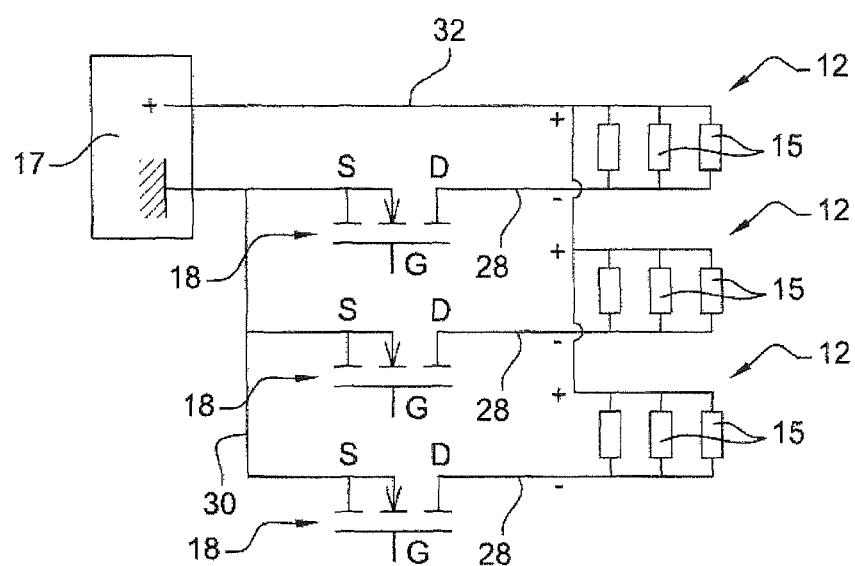

The invention will be better understood and other details, features and advantages of the invention will become apparent on reading the following description given by way of non-limiting example with reference to the attached drawings in which:

FIG. 1 is a schematic view illustrating the mounting of a MOSFET between the negative terminal of a heating element and the ground of a battery, in the case of normal operation of the MOSFET, in accordance with the prior art, FIG. 2 is a view corresponding to FIG. 1, illustrating a degraded state of the MOSFET, namely an impeding short-circuit state between the drain and the source, FIG. 3 is a view corresponding to FIG. 1, illustrating a completely open degraded state of the MOSFET and a degraded state of the printed circuit board, FIG. 4 is a plan view of a part of the printed circuit board, illustrating the case of FIG. 3, FIG. 5 is a front view of a heating device according to the invention, FIG. 6 is a plan view of a control module according to the invention, belonging to the heating device of FIG. 4, FIG. 7 is a bottom view of a printed circuit board belonging to the control module according to the invention, FIG. 8 is a plan view of the printed circuit board illustrating the different electrically conductive tracks, FIG. 9 is a schematic view of the power electrical wiring of the heating device.

FIG. 1 illustrates a normal mode of operation of a power transistor 1 such as a field-effect transistor with metal-oxide gate, also called MOSFET, mounted on a printed circuit board. Such a transistor 1 conventionally comprises a first terminal D called drain, a second terminal S called source and a third terminal G called gate and making it possible to control the opening and the closing of the MOSFET.

The drain D is for example linked electrically to the negative terminal of a heating module 2, notably via a first electrically conductive track 3 (FIG. 4), the positive terminal of the heating module 2 being linked to a potential formed for example by the positive terminal of a battery. The source S is for example linked to the negative terminal or ground of the battery, notably via a second electrically conductive track 4.

Thus, in normal operation, when the MOSFET 1 is open, no current flows in the heating module 2. Conversely, when the MOSFET 1 is closed, a current passes into the heating module 2.

When the MOSFET 1 is closed, that is to say when it is in the on state, it has a resistance Rdson with a value of, for example, the order of 4 mΩ. Since the current passing into the MOSFET 1 is relatively great, a quantity of heat of, for example, between 2 W and 3 W is dissipated by the MOSFET 1 in normal operation.

There is also a very low risk of the MOSFET 1 being damaged in operation. In most cases, this damage translates into an impeding short-circuit state between the drain D and the source S. Such a degraded state is illustrated in FIG. 2.

In other words, the MOSFET 1 behaves as if an impedance 5 (internal to the MOSFET 1) were mounted in parallel between the drain D and the source S. This impedance 5 has, for example, a value of the order of 40 mΩ. The heat then dissipated by the MOSFET 1 is, for example, of the order of 30 W.

This heat can, ultimately, lead to a progressive degradation of the material of the printed circuit board (FIG. 4), this degradation transforming this usually insulating material into a relatively conductive material.

If such a degradation extends between the drain D and the source S, more particularly between the conductive tracks 3, 4 to which the drain D and the source S are electrically linked, the degraded material 6 of the printed circuit board acts as a resistance (FIG. 5). In parallel, the MOSFET 1 ends up opening completely such that the negative terminal of the heating element 2 is linked to the negative terminal or ground of the battery via the resistor 7 formed by the degraded material 6 of the printed circuit board. In this case, this resistor 7 is, for example, of the order of 10Ω. The heat dissipated by this resistor 7 is then of the order of 10 to 15 W.

Given the significant quantity of heat to be dissipated in this case, there is a risk of this heat causing a fire to start or smoke to be generated on the printed circuit board and/or surrounding elements.

FIG. 5 represents an add-on electric heating device 10 according to the invention, intended to equip a motor vehicle. Such a heating device 10 is notably used in the first minutes of use of the motor vehicle, when the engine is not hot enough to ensure the supply of hot air into the vehicle interior.

This device 10 comprises a parallelepipedal support frame 11 on which are mounted parallel heating modules 12 arranged so as to be passed through by the flow of air to be heated. The heating modules 12 are controlled using a control module 13 (FIG. 6), or driver, mounted in a case 14 fixed to the support frame 11.

Each heating module 12 comprises two electrodes or terminals referenced + and − in FIG. 9, between which are placed resistive elements 15 (FIG. 9) of positive temperature coefficient (PTC) type. Two opposing heat sinks 16 are fixed onto the electrodes, so as to increase the surface area of exchange with the flow of air to be heated. The heat sinks 16 are, for example, formed from pleated or corrugated metal strips.

Each heating module 12 thus comprises a positive terminal linked electrically to the positive terminal of a battery 17, and a negative terminal linked electrically to the negative terminal of the battery 17 via a power transistor 18, such as a field-effect transistor with metal-oxide gate (MOSFET).

The control module 13 comprises a printed circuit board 19 comprising first areas 20 on which the MOSFETs 18 are mounted and a second area 21 on which various electrical and electronic components are notably soldered or mounted (FIGS. 7 and 8).

Each first area 20 is of generally rectangular form and comprises, on its top face, a first track 22 (FIG. 8) extending over most of the first area 20 and linked to the drain D of the corresponding MOSFET 18. More particularly, each MOSFET 18 comprises a sole plate forming the drain D, in electrical contact with the first track 22 and soldered onto the latter.

The second area 21 of the electronic board 19 comprises a top face on which are formed, respectively, three second electrically conductive tracks 23 and three third electrically conductive tracks 24, situated globally facing the corresponding first tracks 22, and a fourth electrically conductive track 25 linked to the negative terminal or ground of the battery 17. The fourth track 25 extends over most of the second area and forms a ground plane, as is better described hereinbelow. Each second track 23 is linked to the ground plane 25 via a resistor or "shunt" 26 (FIG. 6) making it possible to perform an electrical current measurement. The value of this "shunt" is very low, of the order of a few milliohms.

The printed circuit board 19 comprises three slits 27 situated respectively between each first area 20 and the second area 21 of the printed circuit board 19, each slit 27 forming a discontinuity of material, at least partial, between the first and second areas 20, 21 of the printed circuit board 19, said slit 27 being situated or inserted notably between the first and second conductive tracks 22, 23.

This slit 27 is generally U-shaped (or L-shaped depending on the applications and on the position of the slit) and comprises a base from which two branches extend.

As can be better seen in FIG. 7, the drain D of each MOSFET 18 is linked to the negative terminal of the corresponding heating module 12 via the corresponding first track 22 and a first conductor bar 28 comprising terminations soldered onto the first track 22.

The source S is formed by a first pin 29 of the MOSFET 18 and is linked to the negative terminal or ground of the battery 17, via the second and fourth tracks 23, 25 of the printed circuit board 19, via the corresponding "shunt" 26 and via a second conductor bar 30 comprising terminations soldered onto the fourth track 25. Hereinafter in the description, the presence of the "shunt" 26 will be disregarded, for the purpose of simplifying the explanation.

Finally, the gate G of the MOSFET 18 is formed by a pin 31 serving as input for a control signal making it possible to control the opening and the closing of the MOSFET 18, said pin 31 being soldered onto the corresponding third track 24 of the printed circuit board 19.

The electrical link between the positive terminals of the battery 17 and of the heating modules 2 is provided by a third conductor bar 32.

The different conductor bars 28, 30, 32 are linked mechanically to one another and electrically insulated from one another by a fitting 32 overmolded with synthetic material and acting as support in such a way that said conductor bars 28, 30, 32 and the fitting 33 form a unitary assembly. The fitting 33 is fixed onto the printed circuit board 19.

As indicated previously, when a MOSFET 18 is open, no current flows through the corresponding resistive elements 15. Conversely, when the MOSFET 18 is closed, a current flows in the resistive elements 18 and thus causes the temperature of the corresponding heating module 12 to rise.

Each MOSFET 18 can be opened and closed cyclically, the temperature reached by each heating module 12 then being a function of the opening and closure times of the MOSFET 18.

The presence of the slits 27 makes it possible to avoid the case represented in FIG. 3, in which a degradation of the material 6 of the printed circuit board 19 can lead to a strong rise in temperature.

This slit 27 prevents the degraded material 6 from acting like a resistor 7 placed between the potential of the drain D (first track 22) and that of the source S (second track 23 or fourth track 25). It will be recalled that, given the negligible influence of the "shunt" 26, the potential of the second and fourth tracks 23, 25 is substantially identical.

The invention claimed is:

1. A control module for an electric appliance, comprising:
a printed circuit board, on which are mounted electrical and electronic components and at least one power transistor,
wherein the power transistor is fixed onto a first area of the printed circuit board and comprises:
a first terminal called drain, linked to a first electrically conductive track of said first area;
a second terminal called source, linked to a second electrically conductive track of a second area of the printed circuit board; and
a third terminal called gate, and
wherein the printed circuit board comprises at least one opening forming a discontinuity of material, at least partial, between the first and second areas of the printed circuit board, said opening being situated between the first and second conductive tracks.

2. The control module as claimed in claim 1, wherein the power transistor comprises a sole plate forming the drain, in electrical contact with the first track, and a pin forming the source, linked electrically to the second track.

3. The control module as claimed in claim 1, wherein the opening is a slit encircling, at least partially, the first area of the printed circuit board.

4. The control module as claimed in claim 3, wherein the slit is generally U- or L-shaped and comprises a base from which extends at least one branch.

5. A heating device for a motor vehicle, comprising a control module as claimed in claim 1.

6. The heating device as claimed in claim 5, further comprising at least one heating module comprising a first terminal linked electrically to a first terminal of a battery, a second terminal linked electrically to the drain of the power transistor, via a first electrical link member, a second terminal of the battery being linked electrically to the source of the power transistor, via a second electrical link member, the first terminal of the module being linked electrically to the first terminal of the battery via a third electrical link member, the three link members being linked mechanically to one another via an electrically insulating fitting.

* * * * *